United States Patent [19]

Toshiaki

[11] Patent Number: 4,700,233

[45] Date of Patent: Oct. 13, 1987

[54] IMAGE SENSORS HAVING ALTERNATING ARRAYS OF HIGH AND LOW SENSITIVITY PICTURE ELEMENTS

[75] Inventor: Kato Toshiaki, Kanagawa, Japan

[73] Assignee: Fuji Electric Co., Ltd., Kawasaki, Japan

[21] Appl. No.: 849,773

[22] Filed: Apr. 9, 1986

[30] Foreign Application Priority Data

Apr. 10, 1985 [JP] Japan ................................ 60-75573

[51] Int. Cl.$^4$ ............................................. H04N 3/14
[52] U.S. Cl. ............................ 358/213.22; 358/213.19
[58] Field of Search ....................... 358/213, 212, 209

[56] References Cited

U.S. PATENT DOCUMENTS 4,514,765  4/1985  Miyata et al. .................... 358/213
4,570,076  2/1986  Hamano et al. .................. 358/213

Primary Examiner—Gene Z. Rubinson
Assistant Examiner—Stephen Brinich
Attorney, Agent, or Firm—Brumbaugh, Graves, Donohue & Raymond

[57] ABSTRACT

Image sensors comprising an alternating array of two or more sets of photoelectric devices provide enhanced detail and reproduction of intermediate illuminances. The sets of photoelectric devices are selected such that each set produces a different level of output in response to the same level of illuminance.

4 Claims, 6 Drawing Figures (a)

(b)

IMAGE SENSORS HAVING ALTERNATING ARRAYS OF HIGH AND LOW SENSITIVITY PICTURE ELEMENTS

BACKGROUND OF THE INVENTION

The present invention relates to a solid state image sensor for use in picture information processing devices such as facsimile transmitter/receivers, character readers and television.

Various image sensing devices are presently known which are useful in picture information processing devices. These include charge transfer devices, such as CCD's and BBD's, and XY address devices, such as one-dimensional line sensors and two-dimensional area sensors. Each of these known devices, however, suffers from a common drawback with regard to accurately dealing with variations in illuminance caused by shading, colors, or differences in paper quality.

A typical image sensor according to the prior art contains an array of photoelectric devices, each of which represents a picture element or pixel in the reproduced image. The illuminance from each region of the subject picture causes the corresponding photoelectric device to produce an output signal, a high illuminance leading to a high output signal. The output signal from each photoelectric device is then compared with some arbitrary threshold level, T to determine if the picture element should be black or white.

FIG. 1 shows graphically the output currents from a conventional image sensor of the line type. T is the threshold output level for distinguishing picture elements between black and white. Any region of the subject picture that causes the photoelectric device to produce an output current greater than T for example $I_{11}$, gives rise to a white picture element. Any region of the subject picture having an illuminance that causes the photoelectric device to produce an output less than T for example $I_{12}$, gives rise to a black picture element. Similar principles are used in conjunction with filters to generate color images.

From this description, it can be seen that the accuracy of reproduction for subject pictures having variable illuminance is troublesome. Picture regions which are gray are converted to either black or white, depending on where the threshold level is set, giving rise to loss of detail. This problem can also limit the utility of differing papers and inks, unless some provision is made to vary the threshold level to correct for differing reflectivities. Mechanisms are available to make this correction, but their use increases the cost and the time required for transmitting images.

It is the object of the present invention to provide image sensing devices which correctly represent regions of intermediate illuminance, thus preserving detail in the transmitted image and minimizing the need for correction mechanisms.

SUMMARY OF THE INVENTION

Image sensors according to the invention, which correctly represent intermediate illuminances, comprise an array of two or more sets of photoelectric devices. The sets of photoelectric devices are selected such that they produce differing output levels in response to the same level of illumination. Such differing responses can be achieved, for example, by utilizing photoelectric devices having different effective photoelectric conversion areas, by using different biasing voltages, and by using different amplification factors.

The sets of photoelectric devices are arranged in the image sensor in an alternating fashion, to provide a uniform distribution of each type of photoelectric device over the entire surface of the image sensor.

DETAILED DESCRIPTION OF THE INVENTION

Figure 1:
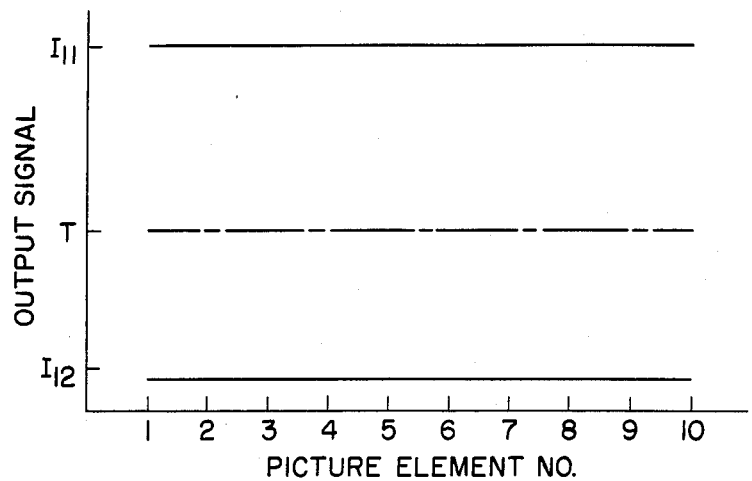
FIG. 1 is a graph of the output levels of photoelectric devices within an image sensor according to the prior art.
Figure 2:
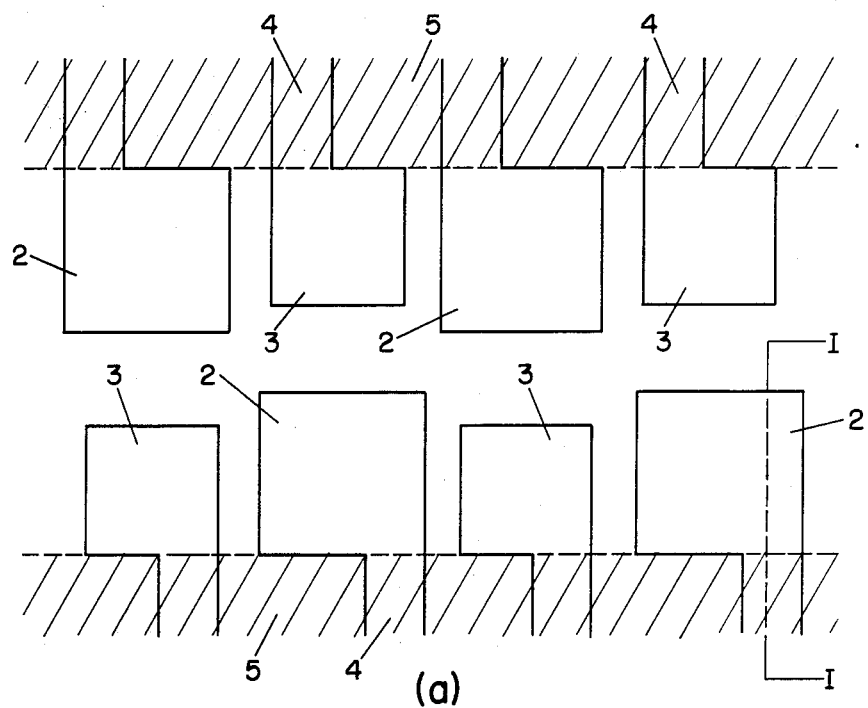
FIG. 2 shows an image sensor according to the invention, (a) being a plan view of the photoelectric devices, and (b) being a cross-sectional view along section line I.
Figure 2:
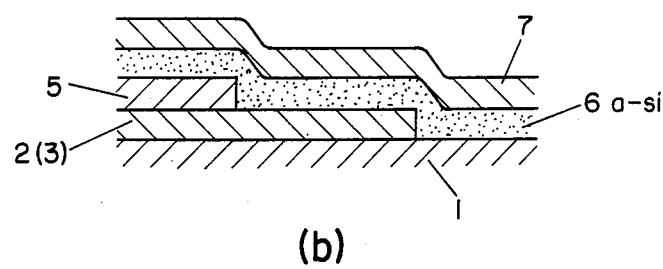

Image sensors according to the invention comprise an alternating array of two or more sets of photoelectric devices, said sets of photoelectric devices being selected such that each set produces a different level of output in response to the same level of illuminance. FIG. 2 illustrates one embodiment of the claimed invention.

FIG. 2(a) shows a plan view of an image sensor containing two rows of alternating electrodes 2 and 3 having different sizes arranged on a substrate 1 (FIG. 2(b)). The electrodes do not touch one another. Extensions 4 from the electrodes 2 and 3 are provided for electrical connection with the remainder of the apparatus. An insulating film 5 is applied over the extensions 4.

As shown in FIG. 2(b), a layer of amorphous silicon 6 is applied over the partially insulated electrodes. Finally, a transparent common counter electrode 7 is applied over the amorphous silicon 6.

Figure 3:
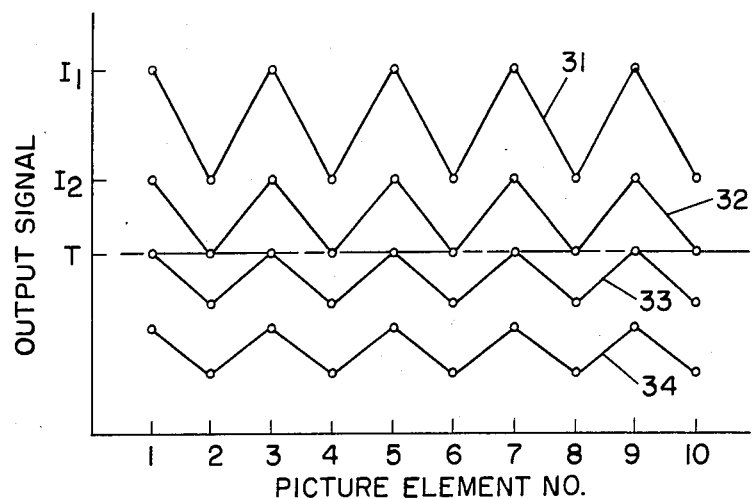
FIG. 3 is a graph of the output levels of photoelectric devices having two different photosensitivities within an image sensor according to the invention.
Figure 4:
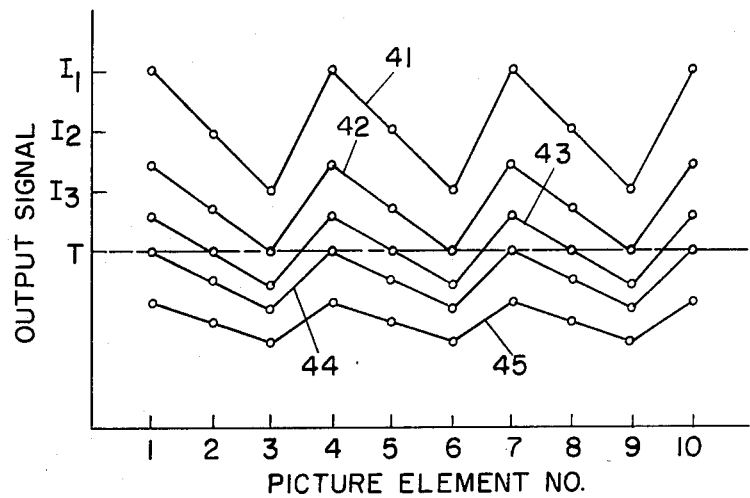
FIG. 4 is a graph of the output levels of photoelectric devices having three different photosensitivities within an image sensor according to the invention.

The principle by which an image sensor according to the invention operates is illustrated in FIGS. 3 and 4 for line type image sensors. FIG. 3 shows outputs for an image sensor having alternating photoelectric devices of two different photosensitivities. The high sensitivity devices which are positioned at odd numbered picture element positions produce output $I_1$ when exposed to some high level of illuminance, while the low sensitivity devices which are positioned at the even-numbered picture element positions produce output $I_2$ in response to the same level of illuminance, as represented by the response curve 31. Similarly, different outputs are produced by the high and low sensitivity devices, respectively, in response to some low level of illuminance, as illustrated by the response curve 32. T is the threshold output level used to discriminate between black and white picture elements. The terms photosensitivity and sensitivity of a photoelectric device as used hereinafter and in the claims shall refer to the ratio of the output level associated with a photoelectric device to the illumination to which the device is exposed. The output level may be varied, for example by changing the effective photoelectric conversion area, the bias applied to the device, or the amplification provided by any amplifier means associated with the device.

At high levels of illuminance, both the high and the low sensitivity photoelectric devices produce outputs greater than T and yield white picture elements, as illustrated by response curve 31 in FIG. 3. At some lower illumination, the high sensitivity devices continue to produce outputs above T, but the outputs of the low sensitivity devices are less than or equal to T. This situation, depicted in FIG. 3 by response curve 32, results in alternating white and black picture elements. At still lower illuminances, the output from the all the devices falls below T, as illustrated by the response curve 33, and all the picture elements become black, and remain so at still lower illuminances, as represented by the response curve 34.

As a result of using an image sensor having the response characteristics depicted in FIG. 3, regions of intermediate illuminance are represented as a pattern of alternating dots or lines which appear visually as a gray. Thus, the object of achieving improved detail and reproduction of intermediate illuminances without the use of a correcting mechanism is obtained.

Still greater improvement can be realized by utilizing photoelectric devices of three different photosensitivities, as shown in FIG. 4. Devices at picture element positions 1, 4, 7 and 10 make up one set having a first photosensitivity; devices at picture element positions 2, 5 and 8, and devices at picture element positions 3, 6 and 9 the other two sets having a second and a third photosensitivity, respectively. The first photosensitivity is higher than the second and the third. The second photosensitivity is greater than the third.

At high illuminance, all of the outputs are above T, and produce white picture elements as depicted by the response curve 41. As the illuminance drops, the outputs of the devices having the third sensitivity fall below T, as illustrated by the response curve 42, and a pattern of "white-white-black" is produced. At still lower illuminance, as depicted by the response curve 43, two sets of devices having the second and third sensitivities produce outputs below T, yielding a pattern of "white-black-black". Finally, at some level of illuminance, all the outputs fall below T, as depicted by the response curve 44, and all black picture elements result. At still lower illuminations, as illustrated by the response curve 45, the elements remain all black.

EXAMPLE 1

A photoconductor such as that depicted in FIG. 2 was prepared. Square electrodes 2 and 3 consisting of chromiun (Cr) were alternately arranged on a glass substrate 1, as shown in FIG. 2(a), to form two arrays, each consisting of 3456 electrodes. The electrodes do not touch one another. The electrodes 2 and 3 had dimensions of 55 $\mu m \times 55$ $\mu m$ and 46 $\mu m \times 46$ $\mu m$, respectively. Extensions 4 from electrodes 2 and 3 were covered with an insulating film 5 consisting of silicon dioxide. An amorphous silicon (a—Si) film 6 was formed to a thickness of 1 $\mu m$ by glow discharge decomposition of silane gas. The a—Si film 6 covered the entire surface of the image sensor.

Finally, a common electrode 7 was formed on the a—Si using indium-tin-oxide (ITO). The ITO electrode had a width of 1 mm and a thickness of 700 Å, and was situated opposite the entire array of electrodes 2 and 3.

Figure 5:
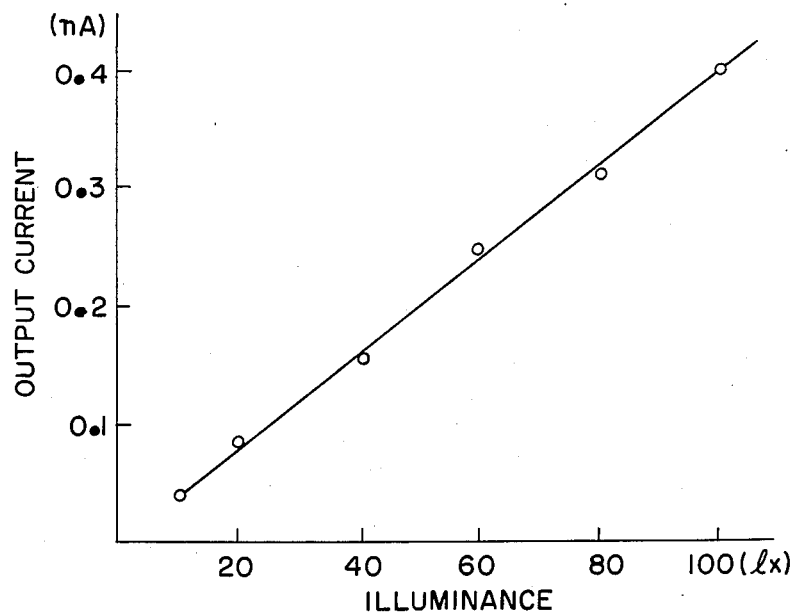
FIG. 5 is a graph showing the relationship between output current and illuminance for a photoelectric device useful in the invention.

A biasing voltage of +5 V was applied to electrodes 2 and 3 in this device during exposure to an illuminance of from 10 to 100 lux and the output currents were measured. As shown in FIG. 5, the output current from the device is proportional to illuminance.

Figure 6:
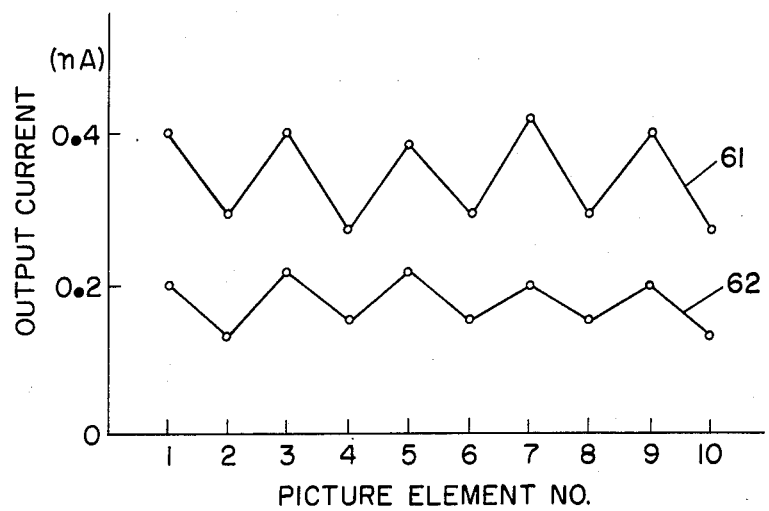
FIG. 6 is a graph showing the outputs from a photoelectric device according to the invention.

FIG. 6 shows the output levels from the device at two levels of illuminance, 50 and 100 lux. Response curve 61 shows the output currents observed at 100 lux, while response curve 62 shows the output currents at 50 lux. In FIG. 6, the odd-numbered devices are those having the larger surface area. The ratio of the current values from the two sets of devices is approximately the same as the area ratio, irrespective of illumination.

EXAMPLE 2

For comparison purposes, image sensors were prepared and tested in a facsimile machine. Sensors according to the prior art were prepared by preparing a line of 3456 Cr electrodes measuring 50 $\mu m \times 50$ $\mu m$ on a glass substrate. The sensor was then completed in accordance with Example 1. Sensors according to the invention were prepared using a single line array of 3456 Cr electrodes of two alternating sizes as described in Example 1. These sensors were used as intimate contact type image sensors in a facsimile machine.

The test subject transmitted by facsimile was a photograph composed of a white portion having a reflectivity of 80%, a black portion having a reflectivity of 5%, and an intermediate colored portion having a reflectivity at 550 nm, the wavelength used, of 43%.

Using sensors according to the prior art, all of the intermediate portion was reproduced as white upon facsimile transmission. Using sensors according to the invention, an image close to the original image was achieved. Microscopically, the intermediate colored portions were represented by stripes of black and white having the same width as the picture elements. These stripes can be replaced by dots, however, by using an array such as that shown in FIG. 2(a), wherein successive rows of electrodes are staggered. This produces a further improvement in image quality.

The invention has been described above in terms of black and white images and exemplified using a photoconductor, but is in no way limited to these embodiments. One skilled in the art would understand that the principles of the invention are fully applicable to color as well as black and white image sensors. Furthermore, one would understand that any type of photoelectric device could be used, so long as the output from the device could be conveniently varied.

I claim:

1. An image sensing device comprising a planar array of photoelectric devices, wherein the array of photoelectric devices comprises a first set of photoelectric devices having a first photosensitivity, and a second set of photoelectric devices having a second photosensitivity different from said first photosensitivity, said first and second sets being arranged in an alternating fashion.

2. An image sensor according to claim 1, wherein the sets of photoelectric devices have different effective photoelectric conversion areas.

3. An image sensor according to claim 1, wherein different biasing voltages are respectively applied to the sets of photoelectric devices.

4. An image sensor according to claim 1, wherein amplification means are connected to the sets of photoelectric devices, said amplification means having different amplification factors.

* * * * *